US010171977B2

(12) United States Patent
Orten et al.

(10) Patent No.: US 10,171,977 B2
(45) Date of Patent: Jan. 1, 2019

(54) COMMUNICATION NETWORK, A POWER CONVERTER CABINET, AND A METHOD THEREFORE

(71) Applicant: ABB Schweiz AG, Baden (CH)

(72) Inventors: Pal Orten, Asker (NO); Batool Talha, Nesbru (NO); Simon Douglas Round, Zürich (CH); Anne Vallestad, Sandvika (NO)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/563,149

(22) PCT Filed: Apr. 6, 2016

(86) PCT No.: PCT/EP2016/057510
§ 371 (c)(1),
(2) Date: Sep. 29, 2017

(87) PCT Pub. No.: WO2016/169769
PCT Pub. Date: Oct. 27, 2016

(65) Prior Publication Data
US 2018/0091931 A1 Mar. 29, 2018

(30) Foreign Application Priority Data
Apr. 22, 2015 (EP) ..................................... 15164630

(51) Int. Cl.
H04W 4/80 (2018.01)
H04B 7/26 (2006.01)
(Continued)

(52) U.S. Cl.
CPC ................ H04W 4/80 (2018.02); H04B 7/26 (2013.01); H05K 5/0017 (2013.01); H05K 9/0049 (2013.01)

(58) Field of Classification Search
CPC .... H04W 4/008; H05K 5/0017; H05K 9/0049
(Continued)

(56) References Cited
U.S. PATENT DOCUMENTS 5,697,063 A 12/1997 Kishigami et al.
7,113,134 B1 9/2006 Berkman
(Continued)

FOREIGN PATENT DOCUMENTS
EP 3086486 A1 10/2016

OTHER PUBLICATIONS

European Search Report Application No. 15164630.4 Completed: Oct. 6, 2015; dated Oct. 13, 2015 6 pages.
(Continued)

Primary Examiner — Md Talukder
(74) Attorney, Agent, or Firm — Whitmyer IP Group LLC

(57) ABSTRACT

A communication network and a power converter cabinet including a control unit, a power switch, a sensor and wherein the first communication point is connected to the control unit inside the power converter cabinet, and the second communication point is connected to the power switch, and a sensor inside the power converter cabinet. The communication network includes: a first antenna configured to wirelessly transmit/receive in the mm-wave frequency band, and a second antenna configured to receive/transmit wirelessly in the mm-wave frequency band, wherein the first and second communication points are configured to set up a communication link with multiple propagation paths, to send data between different active devices inside the power converter cabinet.

21 Claims, 3 Drawing Sheets

(51) Int. Cl.
*H05K 5/00* (2006.01)
*H05K 9/00* (2006.01)

(58) Field of Classification Search
USPC .................................. 455/41.1, 41.2, 41.3
See application file for complete search history.

(56) References Cited

U.S. PATENT DOCUMENTS

| | | | |
|---|---|---|---|
| 8,149,178 B2 | 4/2012 | Alamouti et al. | |
| 8,494,567 B2 | 7/2013 | Lorgeoux et al. | |
| 8,797,211 B2 | 8/2014 | Valdes-Garcia | |
| 2003/0224801 A1* | 12/2003 | Lovberg ............... | H01Q 1/125 455/454 |
| 2006/0093055 A1* | 5/2006 | Goldberg .............. | H01Q 1/241 375/267 |
| 2009/0028177 A1* | 1/2009 | Pettus ................... | G06F 13/385 370/463 |
| 2009/0323860 A1* | 12/2009 | Ghauri ................. | H04L 25/03006 375/299 |
| 2012/0207138 A1 | 8/2012 | Korn et al. | |
| 2013/0107853 A1* | 5/2013 | Pettus ................... | H04W 84/10 370/330 |
| 2014/0177742 A1 | 6/2014 | Maltsev et al. | |
| 2014/0233460 A1* | 8/2014 | Pettus ................... | H04Q 1/15 370/328 |

OTHER PUBLICATIONS

International Search Report and Written Opinion of the International Searching Authority Application No. PCT/EP2016/057510 Completed: Jun. 14, 2016; dated Jun. 21, 2016 11 pages.

Jong Ho Kim et al: "Antenna directivity effect on the delay spread at millimeter-wave", Advanced Communication Technology (ICACT), 2011 13th International Conference on, IEEE, Feb. 13, 2011 (Feb. 13, 2011), pp. 8-12.

Sridhar Rajagopal et al: "Channel Feasibility for Outdoor Non-Line-of-Sight mmWave Mobile Conmunication", Vehicular Technology Conference (VTC Fall), 2012 IEEE, IEEE, Sep. 3, 2012 (Sep. 3, 2012), pp. 1-6.

* cited by examiner

COMMUNICATION NETWORK, A POWER CONVERTER CABINET, AND A METHOD THEREFORE

TECHNICAL FIELD

The invention relates to a communication network in a power converter cabinet. The invention also relates to a power converter cabinet and a method for communication within a power converter cabinet.

BACKGROUND

Communication is an essential and integrated part of power converters. This communication needs to be robust and reliable, and with rather low latency. A control unit needs to communicate with several or even hundreds of units or more building blocks/cells/power modules. Communicating units may be placed at different potentials (several kilovolts plus), requiring electrical isolation between the transmitters and receivers.

A traditional solution to this communication problem has been the use of optical fibres, which can provide sufficiently low latency, adequate data rates, and also electrical isolation. A problem with these optical components is that their performance deteriorates over time. Moreover, they also require substantial installation efforts, and some space for the cables which may not always be available, resulting in damage caused by excessive bending, etc.

State of the art solutions typically apply
- fibre optics, which are expensive and deteriorate over time, and require time consuming installation
- other optical solutions like free-space optics alone or in combination with wired communications like for instance Ethernet or EtherCAT or similar, where the free space optics part provides the electrical isolation.

Jong Ho Kim et al: "Antenna directivity effect on the delay spread at millimeter-wave", ADVANCED COMMUNICATION TECHNOLOGY (ICACT), 2011 13th International conference on, IEEE, (2011-02-13), pages 8-12, presents a delay spread characteristics at millimeter-wave band study.

It has been proposed the use of wireless control of power network switching devices in US2012207138.

SUMMARY

An object of the present invention is to improve communication reliability for power converters inside a cabinet.

According to a first aspect, it is presented a communication network in a power converter cabinet. The power converter cabinet comprises at least a control unit and at least a power switch, a sensor or an actuator. The communication network comprises: a first communication point, provided with a first antenna configured to wirelessly transmit/receive in the mm-wave frequency band, with an opening angle of between 20 and 180 degrees, wherein the first communication point is connected to the at least a control unit inside the power converter cabinet; and a second communication point, provided with a second antenna configured to receive/transmit wirelessly in the mm-wave frequency band, with an opening angle of between 20 and 180 degrees, wherein the second communication point is connected to the at least a power switch, a sensor or an actuator inside the power converter cabinet; wherein the first and second communication points are configured to set up a communication link with multiple propagation paths, to send data between different active devices and/or components inside the power converter cabinet.

The mm-wave frequency band may be 30-300 GHz, preferably 40-100 GHz, and more preferably about 60 GHz.

The opening angle may be between 70 and 150 degrees, and preferably about 120 degrees.

The communication network may comprise a third communication point, provided with a third antenna configured to receive/transmit wirelessly in the mm-wave frequency band, with an opening angle of between 20 and 180 degrees, wherein the first, second and third communication points are configured to set up communication links with multiple propagation paths, to send data between different active devices and/or components inside the power converter cabinet.

The cabinet may be an at least partly closed cabinet in the sense that wireless mm-wave signals are reflected on its cabinet walls, wherein the cabinet walls may be metallic.

The cabinet may comprise components and support structures being obstacles for direct line-of-sight between two communication points and providing arbitrary reflection surfaces for the wireless mm-wave signals.

According to a second aspect, it is presented a power converter cabinet, comprising at least a control unit and at least a power switch, a sensor or an actuator, and a communication network according to the first aspect above.

According to a third aspect, it is presented a method for communication within an at least partly closed power converter cabinet, wherein the power converter cabinet comprises at least a control unit and at least a power switch, a sensor or an actuator. The method comprises the steps of: arranging a first communication point inside the power converter cabinet, which first communication point is configured to wirelessly transmit/receive in the mm-wave frequency band, with an opening angle of between 20 and 180 degrees, wherein the first communication point is connected to the at least a control unit inside the power converter cabinet; and arranging a second communication point inside the power converter cabinet, which second communication point is configured to receive/transmit wirelessly in the mm-wave frequency band, with an opening angle of between 20 and 180 degrees, wherein the second communication point is connected to the at least a power switch, a sensor or an actuator inside the power converter cabinet; wherein the first and second communication points are configured to send data between different active devices and/or components inside the power converter cabinet, with multiple propagation paths.

The method may comprise the step of arranging a third communication point inside the power converter cabinet, which third communication point is configured to receive/transmit wirelessly in the mm-wave frequency band, with an opening angle of between 20 and 180 degrees, wherein the first, second and third communication points are configured to send data between different active devices and/or components inside the power converter cabinet, with multiple propagation paths.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

Figure 1:
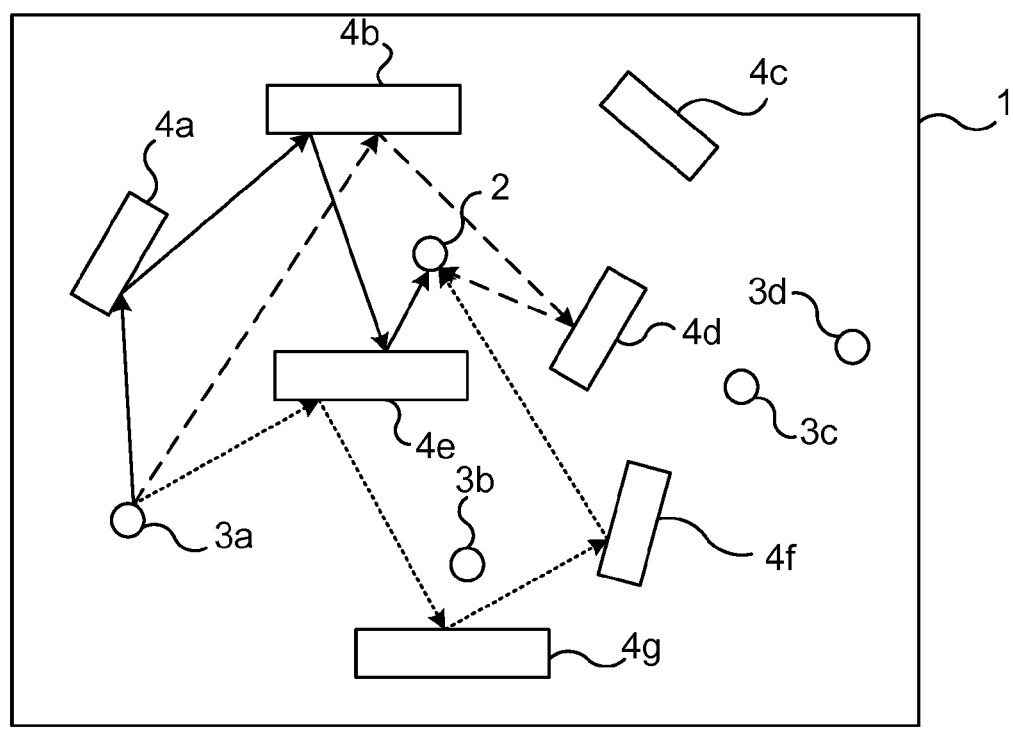
FIG. 1 schematically illustrates multi propagation paths inside a cabinet.

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

The basic idea of the present invention is to utilize non-line-of-sight propagation with millimeter wave radio for time-critical communication in power converter applications.

A solution to time-critical communication in power converter applications could be to apply wireless communication using electromagnetic wave propagation. However, well-known wireless standards or wireless technologies at ISM bands (for Industrial, Scientific and Medical purposes other than telecommunication) cannot easily fulfil the requirements for this rather critical application. In addition, such frequency bands are almost everywhere in the world overcrowded, and thus there is both a capacity problem and a severe interference problem with using that band. To avoid interference into power converter systems with possible errors in the communication causing retransmissions and delays, and also to avoid causing interference to other systems, the present invention uses mm-wave frequencies (i.e., 30-300 GHz) for this application. At such frequencies there is a huge amount of bandwidth available, more or less license free.

Another advantage is that at such high frequencies, the attenuation is rather high, which is beneficial in terms of interference avoidance to and from the power converter system. A reasonable mm-wave frequency is between 40-100 GHz. The attenuation is especially high around 60 GHz due to oxygen absorption. The atmospheric absorption at 60 GHz is a slightly above 10 dB/km in a band around 60 GHz. It can be as high as 15 dB/km exactly at 60 GHz due to oxygen resonance.

However, applying mm-wave communication in power electronics applications has some challenges. The transmitter and receiver cannot be expected to have line-of-sight between them. This is because there are a lot of metallic objects, transformers, capacitors, and other power electronic components obstructing the signal propagation between transmitter and receiver. Thus, in power converter applications we cannot rely on narrow antenna beams and direct line-of-sight communication as is often the case in mm-wave communication.

In an environment with lots of reflecting objects, the resulting signal at a receiver will contain delayed and attenuated replicas of the transmitted signal. This will give a channel transfer function that varies greatly with frequency. For some frequencies and distances the signal components add constructively, whereas at other distances and frequencies the signal will add destructively as the signal components experience different phase shifts. This appears in the channel transfer function as tops (high gains) and zeros (or dips with very low gain). Such behaviour for the channel transfer function has been verified with both finite element calculations and with on-site measurements.

To achieve high reliability, high capacity, and short latency wireless communication inside a power converter cabinet, mm-wave frequency bands are used having non-line-of-sight communication, and antennas are used with appropriate opening angles. The cabinet have obstructing and reflecting metallic as well as non-metallic objects that in general obstruct the line-of-sight between two communication points.

The benefit of the present invention summarizes electrical isolation between nodes, or communication points, high capacity wireless communication possible due to many GHz of available bandwidth, low latency communication due to high data rate (Gbits/s), and limited retransmission due to low interference, flexible low cost installation, only logical connections established by system designer (not during deployment), and antenna orientation is not critical, limited interference from external systems due to high attenuation at mm-waves, and especially for frequencies around 60 GHz, gives high reliability, limited interference to other systems due to high attenuation, practically license-free operation, and flexible network topology possible, including, but not limited to, star topology (point to multipoint).

In FIG. 1, it is schematically illustrated a communication scenario with several communication points. Each of these communication points communicates with one or several of the other communication points in the network using mm-wave wireless communication and antennas with a certain opening angle to allow non-line-of-sight communication. The wireless transmitters and receivers in the network use for instance a point-to-multipoint communication to serve all units or communication points in a flexible way.

The opening angles in this application are for a wide-beam patch antenna. For other types of antennas the same beam width may be provided with other definitions of opening angles.

Arranging of communication points are arbitrarily selected from a radio propagation point of view. A design goal is to place the antenna as close as possible to node with communication need, preferably on the node.

A snapshot of a wireless communication network with transmitting/receiving communication points (each communication point possess both features), together with obstacles obstructing a direct line-of-sight signal path inside a power converter cabinet, is illustrated in FIG. 1. Different line types illustrate a set of different and possible signal propagation paths giving rise to the multipath channel behaviour.

As illustrated in the example of FIG. 1, there are several different propagation paths from one transmitting communication point 3a to the receiving communication point 2. Three different propagation paths are illustrated, one dotted, one dashed and one solid. This allows a communication link to be established despite lack of line-of-sight propagation between the respective communication points 2 and 3a. It is in contrast with the typical behaviour of mm-wave communication, where a direct line-of-sight link is expected.

Inside the power converter cabinet, under non-line-of-sight propagation conditions, the communication is possible as long as the antenna opening angle is sufficiently large to receive reflected waves. Note that the antenna opening angle can, in principle, range from less than 1 degree to 360 degrees. By having very narrow beams with reduced opening angle of the antenna, the multipath characteristics of the channel is reduced to fluctuate less as a function of frequency (more flat). In this situation, there is a risk of not being able to establish connections between communication points with many obstacles between them. By increasing the opening angle of the antenna, it is easier to establish connections, but at the same time the transfer function variations increases as a function of frequency. A larger antenna opening angle also increases the possibility of increased external interference entering into the system. This in turn leads to the fact that the selection of the opening angle of the antenna is an important design decision.

An opening angle of about 120 degrees allows a sufficient number of reflected rays to be received in the application and facilitates in establishing the communication link. If the opening angle is too small, like for instance below 20 degrees, a situation may occur where some locations (communication points) would not have coverage since there is no line-of-sight path, and the opening angle is too small to capture reflected rays. If the opening angle is too large, e.g. more than 180 degrees, a situation with too many reflections being received may occur, leading to an extreme multipath situation which is not resolvable even with advanced signal processing techniques. Utilization of an opening angle of between 70 and 150 degrees provides for a reasonable stability of the communication network.

The signal processing techniques to be applied will depend on the multipath characteristics of the particular system scenario, which depends on e.g. the physical layout of the system, antenna characteristics, size of cabinet, type of components that represent the obstacles, number of obstacles. To facilitate proper reception it may e.g. be advantageous to include some training sequences for channel estimation and carrier recovery, carrier frequency and phase tracking. In some cases it may be sufficient with a simple equalizer or even no equalizer, and in other scenarios advanced modulation like Orthogonal Frequency Division Multiplexing (OFDM) or Code Division Multiple Access (CDMA), Spread Spectrum techniques or combinations of these techniques, possibly in combination with equalization techniques may be advantageous. Some scenarios may also advantageously include some form of diversity reception techniques in combination with advanced error control coding and/or hybrid Automatic Repeat request (ARQ) techniques.

The topology of the communication network may take different forms, including for instance a star network with a central unit and a number of nodes, or a ring network or a mesh network.

Due to the antenna characteristics (frequency and opening angle), multiple propagation paths and obstructing/reflecting objects, communication is established even without line-of-sight between the transmitting and receiving communication points 2 and 3a, due to arbitrary reflections inside the power converter cabinet.

Possible application scenario examples of the present invention are described in connection with FIGS. 2-4.

Figure 2:
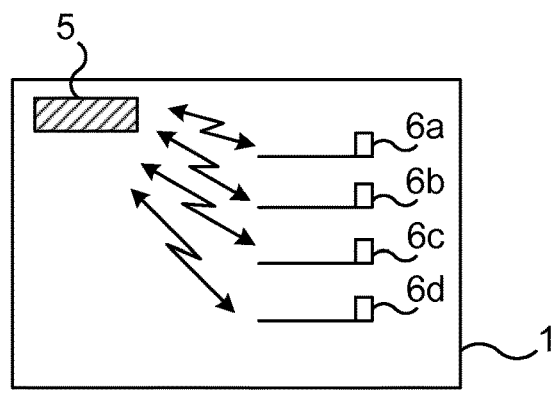
FIG. 2 schematically illustrates a cabinet according to an embodiment of the description.

FIG. 2 schematically illustrates a single cabinet 1 of a power converter. In this case the communication network is used to provide high data-rate, several Gbits/s, information between a controller 5 and multiple power switches 6a-d. These power switches receive data to tell if they are to switch on or off, and to provide fast fault data back to the controller 5, or additionally adjacent power switches. The controller 5 is provided with a first communication point 2 and the power switches 6a-d are each provided with its own communication point 3a-d.

Figure 3:
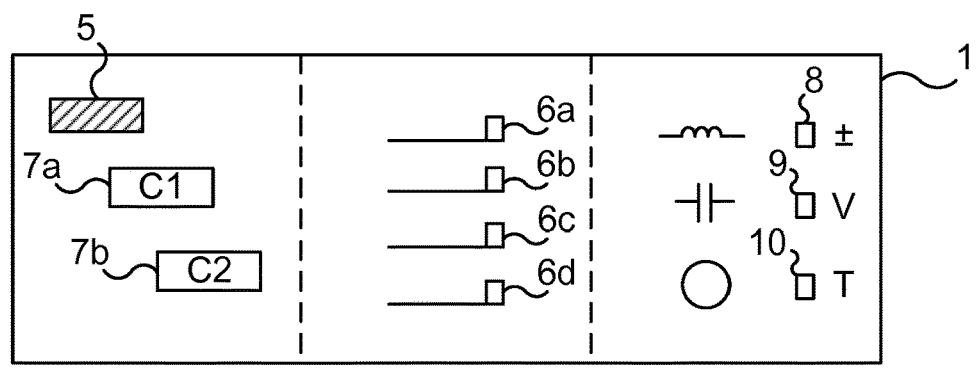
FIG. 3 schematically illustrates a cabinet according to an embodiment of the description.

FIG. 3 schematically illustrates multiple functional cabinets put together to form a power converter system within a closed cabinet 1. In this system, there may be multiple controllers 5, 7a-b and even redundant controllers 7a-b provided, in the left part of the cabinet 1. Here the wireless system is connected to the controllers. Wireless data is then sent to the power switches 6a-d, in the middle part of the cabinet 1, and also to sensors 8-10 in the right part of the cabinet. The sensors/measurement devices can be both high speed and low speed.

The right part of the cabinet may comprise non-active components of the power converter such as inductors 8, capacitors 9 and mechanical switches 10. As part of the overall control process various signals, e.g. voltages V, currents ±, temperatures T, may be measured and transmitted back to the controllers 5, 7a-b. The controllers may also send commands to various actuators in the power converter to e.g. turn on and off fans, open and close contactors, etc. These actuators can receive and transmit both slow and high speed data.

Figure 4:
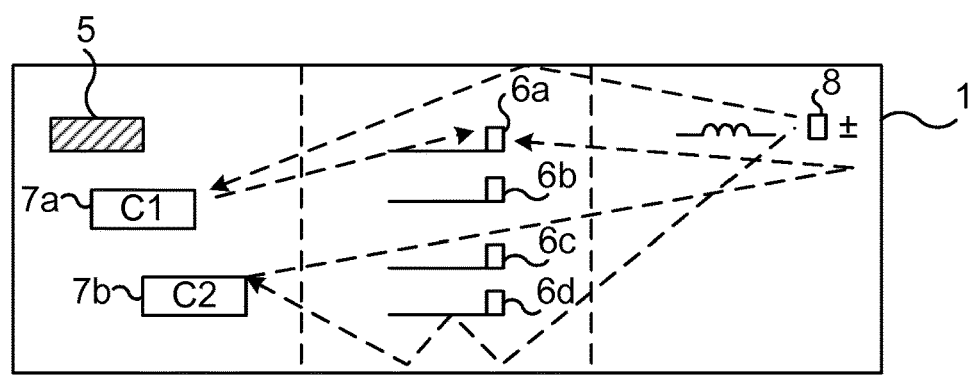
FIG. 4 schematically illustrates a cabinet according to an embodiment of the description.

FIG. 4 schematically illustrates a redundant wireless system in place where data may be sent over different frequencies and different physical paths. In this case the controllers 7a and 7b are two redundant controllers and the controller 5 is a supervising unit. Both of the two redundant controllers are able to receive data from the sensors e.g. high speed current sensor 8, and send switching data to the power switch 6a. One of the controllers e.g. 7a is the active controller and is controlling the switch 6a, while the other controller e.g. 7b is in active standby. If controller 7a fails then 7b may take over the control operation, either automatically or when commanded by the supervising controller e.g. 5.

Applications of a power converter cabinet may include motor speed drives for pumping, traction, and marine applications. Furthermore, it may be used in static converters for wind turbines, excitation systems for power generation, etc.

One of the power converter applications under consideration may call for a highly reliable communication with high data rate and low latency communication solutions. In this invention, the required system features are provided by utilizing mm-wave wireless technology. In addition to the huge available license free bandwidth, the natural limitations (high attenuation, short-range, sever multipath propagation) of mm-wave technology can serve to be beneficial.

Although control of a power switch mainly has been described above, sending of read/write data is equally applicable, for communication between active devices/components such as control units, power switches, sensors and actuators. The power switch may i.a. use the wireless communication to send data back, e.g. status information. Data may also be sent from a sensor back to the controller, or the controller may send a command signal to an actuator.

A communication network in a power converter cabinet 1 is next presented in a more general way with reference to FIGS. 1-4. The power converter cabinet 1 comprises at least a control unit 5 or 7a and 7b and at least a power switch 6a-d, a sensor 8-10 or an actuator. The communication network comprises: a first communication point 2, provided with a first antenna configured to wirelessly transmit/receive in the mm-wave frequency band, with an opening angle of between 20 and 180 degrees, wherein the first communication point 2 is connected to the at least a control unit 5 or 7a and 7b inside the power converter cabinet 1; and a second communication point 3a-d, provided with a second antenna configured to receive/transmit wirelessly in the mm-wave frequency band, with an opening angle of between 20 and 180 degrees, wherein the second communication point 3a-d is connected to the at least a power switch 6a-d, a sensor 8-10 or an actuator inside the power converter cabinet 1; wherein the first and second communication points are configured to set up a communication link with multiple propagation paths, to send data between different active devices and/or components inside the power converter cabinet 1.

The mm-wave frequency band may be 30-300 GHz, preferably 40-100 GHz, and more preferably about 60 GHz.

The opening angle may be between 70 and 150 degrees, and preferably about 120 degrees.

The communication network may comprise a third communication point 3a-d, provided with a third antenna configured to receive/transmit wirelessly in the mm-wave frequency band, with an opening angle of between 20 and 180 degrees, wherein the first, second and third communication points are configured to set up communication links with multiple propagation paths, to send data between different active devices and/or components inside the power converter cabinet 1.

The power converter cabinet 1 may be an at least partly closed cabinet in the sense that wireless mm-wave signals are reflected on its cabinet walls, wherein the cabinet walls may be of a metallic material, or of non-metallic material such as plastic materials, and/or with air gaps.

It is foreseen to have a power converter cabinet which allows some RF signal to be received outside to enable communication to external nodes, e.g., mobile phones, smart devices, tablets etc. by having air gaps in the walls. However, the cabinet walls may still reflect some radio signals to improve communication inside the cabinet.

The power converter cabinet 1 may comprise components and support structures being obstacles 4a-g for direct line-of-sight between two communication points 2, 3a-d and providing arbitrary reflection surfaces for the wireless mm-wave signals.

A power converter cabinet 1 is presented, comprising at least a control unit 5; 7a-b and at least a power switch 6a-d, a sensor 8-10 or an actuator, and a communication network as described above.

Figure 5:
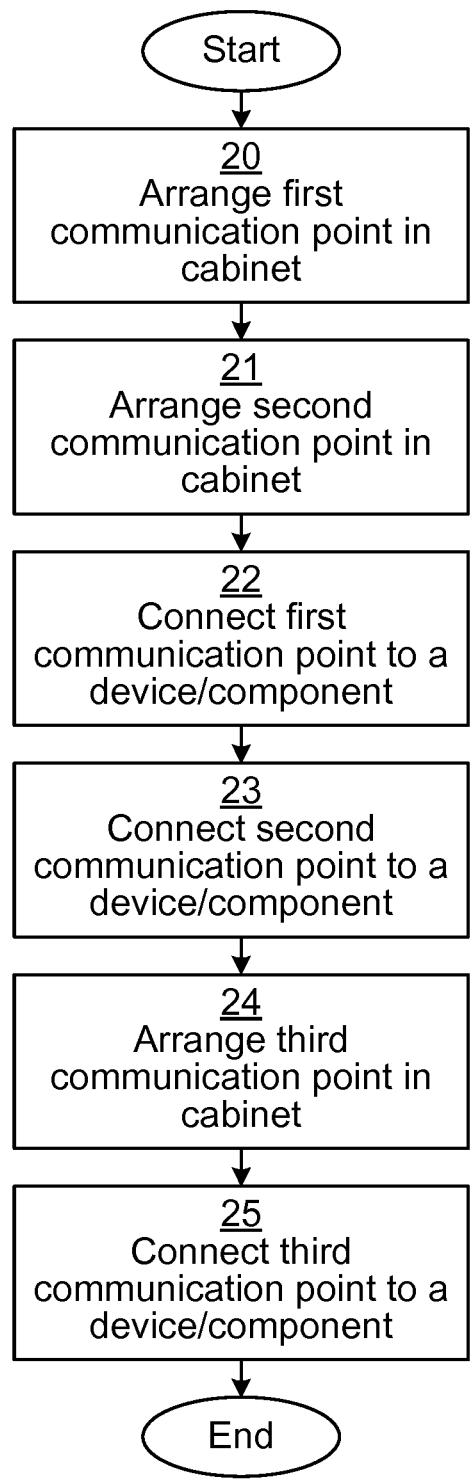
FIG. 5 illustrates the steps of a method according to an embodiment of the description.

A method for communication within an at least partly closed power converter cabinet 1 is presented with reference to FIG. 5. The power converter cabinet 1 comprises at least a control unit 5 or 7a and 7b and at least a power switch 6a-d, a sensor 8-10 or an actuator. The method comprises the steps of: arranging 20 a first communication point 2 inside the power converter cabinet 1, which first communication point 2 is configured to wirelessly transmit/receive in the mm-wave frequency band, with an opening angle of between 20 and 180 degrees, wherein the first communication point 2 is connected to the at least a control unit 5 or 7a and 7b inside the power converter cabinet 1; and arranging 21 a second communication point 3a-d inside the power converter cabinet 1, which second communication point 3a-d is configured to receive/transmit wirelessly in the mm-wave frequency band, with an opening angle of between 20 and 180 degrees, wherein the second communication point 3a-d is connected to the at least a power switch 6a-d, a sensor 8-10 or an actuator inside the power converter cabinet 1; wherein the first and second communication points are configured to send data between different active devices and/or components inside the power converter cabinet 1, with multiple propagation paths.

The method may comprise the step of arranging 24 a third communication point 3a-d inside the power converter cabinet 1, which third communication point 3a-d is configured to receive/transmit wirelessly in the mm-wave frequency band, with an opening angle of between 20 and 180 degrees, wherein the first, second and third communication points are configured to send data between different active devices and/or components inside the power converter cabinet 1, with multiple propagation paths.

The wireless mm-wave signals may be reflected on cabinet walls, wherein the cabinet walls may be of a metallic material facilitating reflection of mm-wave signals.

The wireless mm-wave signals may be arbitrary reflected on components and support structures 4a-g inside the power converter cabinet 1, facilitating communication through multipath propagation inside the power converter cabinet.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A communication network in a power converter cabinet, wherein the power converter cabinet comprises at least a control unit and at least one of a power switch, a sensor, or an actuator, the communication network comprises:
   a first communication point, provided with a first antenna configured to wirelessly transmit and receive in the mm-wave frequency band, with an opening angle of between 20 and 180 degrees, wherein the first communication point is connected to the at least a control unit inside the power converter cabinet; and
   a second communication point, provided with a second antenna configured to receive and transmit wirelessly in the mm-wave frequency band, with an opening angle of between 20 and 180 degrees, wherein the second communication point is connected to the at least one of a power switch, a sensor, or an actuator inside the power converter cabinet;
   wherein either the first communication point transmits and the second communication point receives or the first communication point receives and the second communication point transmits to set up a communication link between each other with multiple propagation paths, to send data between different active devices and/or components inside the power converter cabinet.

2. The communication network according to claim 1, wherein the mm-wave frequency band is 30-300 GHz.

3. The communication network according to claim 1, wherein the opening angle is between 70 and 150 degrees.

4. The communication network according to claim 1, including a third communication point, provided with a third antenna configured to receive/transmit wirelessly in the mm-wave frequency band, with an opening angle of between 20 and 180 degrees, wherein the first, second and third communication points are configured to set up communication links with multiple propagation paths, to send data between different active devices and/or components inside the power converter cabinet.

5. The communication network according to claim 1, wherein the power converter cabinet is an at least partly closed cabinet in the sense that wireless mm-wave signals are reflected on its cabinet walls.

6. The communication network according to claim 5, wherein the cabinet walls are metallic.

7. The communication network according to claim 1, wherein the power converter cabinet comprises components and support structures being obstacles for direct line-of-sight between two communication points and providing arbitrary reflection surfaces for the wireless mm-wave signals.

8. A power converter cabinet, comprising at least a control unit and at least one of a power switch, a sensor, or an actuator, and a communication network including:
- a first communication point, provided with a first antenna configured to wirelessly transmit and receive in the mm-wave frequency band, with an opening angle of between 20 and 180 degrees, wherein the first communication point is connected to the at least a control unit inside the power converter cabinet; and
- a second communication point, provided with a second antenna configured to receive and transmit wirelessly in the mm-wave frequency band, with an opening angle of between 20 and 180 degrees, wherein the second communication point is connected to the at least one of a power switch, a sensor, or an actuator inside the power converter cabinet;
- wherein either the first communication point transmits and the second communication point receives or the first communication point receives and the second communication point transmits to set up a communication link between each other with multiple propagation paths, to send data between different active devices and/or components inside the power converter cabinet.

9. A method for communication within an at least partly closed power converter cabinet, wherein the power converter cabinet includes at least a control unit and at least one of a power switch, a sensor, or an actuator, the method including the steps of:
- arranging a first communication point inside the power converter cabinet, which first communication point is configured to wirelessly transmit and receive in the mm-wave frequency band, with an opening angle of between 20 and 180 degrees, wherein the first communication point is connected to the at least a control unit inside the power converter cabinet; and
- arranging a second communication point inside the power converter cabinet, which second communication point is configured to receive and transmit wirelessly in the mm-wave frequency band, with an opening angle of between 20 and 180 degrees, wherein the second communication point is connected to the at least one of a power switch, a sensor, or an actuator inside the power converter cabinet;
- wherein either the first communication point transmits and the second communication point receives or the first communication point receives and the second communication point transmits to set up a communication link between each other with multiple propagation paths, to send data between different active devices and/or components inside the power converter cabinet.

10. The method according to claim 9, wherein the mm-wave frequency band is 30-300 GHz.

11. The method according to claim 9, wherein the opening angle is between 70 and 150 degrees.

12. The method according to claim 9, including the step of arranging a third communication point inside the power converter cabinet, which third communication point is configured to receive/transmit wirelessly in the mm-wave frequency band, with an opening angle of between 20 and 180 degrees, wherein the first, second and third communication points are configured to send data between different active devices and/or components inside the power converter cabinet, with multiple propagation paths.

13. The method according to claim 9, wherein the wireless mm-wave signals are reflected on cabinet walls.

14. The method according to claim 13, wherein the cabinet walls are metallic.

15. The method according to claim 9, wherein the wireless mm-wave signals are arbitrary reflected on components and support structures inside the power converter cabinet.

16. The communication network according to claim 1, wherein the mm-wave frequency band is 40-100 GHz.

17. The communication network according to claim 1, wherein the mm-wave frequency band is about 60 GHz.

18. The communication network according to claim 1, wherein the opening angle is about 120 degrees.

19. The method according to claim 9, wherein the mm-wave frequency band is 40-100 GHz.

20. The method according to claim 9, wherein the mm-wave frequency band is about 60 GHz.

21. The method according to claim 9, wherein the opening angle is 120 degrees.

* * * * *